(12) United States Patent
Huang

(10) Patent No.: US 10,199,308 B2
(45) Date of Patent: Feb. 5, 2019

(54) LIQUID-COOLED HEAT SINK

(71) Applicant: Dynatron Corporation, Union City, CA (US)

(72) Inventor: Tai-Chi Huang, Union City, CA (US)

(73) Assignee: DYNATRON CORPORATION, Union City, CA (US)

( * ) Notice: Subject to any disclaimer, the term of this patent is extended or adjusted under 35 U.S.C. 154(b) by 0 days.

(21) Appl. No.: 15/495,409

(22) Filed: Apr. 24, 2017

(65) Prior Publication Data

US 2018/0308786 A1 Oct. 25, 2018

(51) Int. Cl.
*F28D 15/00* (2006.01)
*H01L 23/473* (2006.01)
*H01L 23/433* (2006.01)

(52) U.S. Cl.
CPC .......... *H01L 23/473* (2013.01); *H01L 23/433* (2013.01)

(58) Field of Classification Search
CPC ... H01L 23/473; H01L 23/433; H01L 23/367; H01L 23/467; H01L 21/4882; H01L 23/427; H05K 7/20; H05K 7/20263; H05K 7/20272; F28F 7/00; F28F 7/02; G06F 1/20; F28D 15/0266
USPC .................................................... 165/104.11
See application file for complete search history.

(56) References Cited

U.S. PATENT DOCUMENTS

| 7,971,632 | B2 | 7/2011 | Eriksen |
| 8,245,764 | B2 | 8/2012 | Eriksen |
| 8,274,787 | B2 | 9/2012 | Alyaser et al. |
| 8,356,505 | B2 | 1/2013 | Carper et al. |
| 9,818,671 | B2 * | 11/2017 | Huang .................. H01L 23/427 |
| 2004/0140084 | A1 * | 7/2004 | Lee ..................... F28D 15/0266 165/104.11 |

* cited by examiner

*Primary Examiner* — Davis Hwu
(74) *Attorney, Agent, or Firm* — Muncy, Geissler, Olds & Lowe, P.C.

(57) ABSTRACT

A liquid-cooled heat sink includes a heat absorption module having a liquid storage container with one heat conductive side, a liquid inlet and a liquid; a liquid transport module including one inlet tube having a first end connected spatially with the liquid inlet of the storage container and a second end connected spatially with a pump unit, and an outlet tube having a first end connected spatially with the liquid outlet of the storage container and a second end connected spatially with a storage chamber; and a heat exchange module including a fin assembly, one connection passage extending through the fin assembly and one fan unit disposed on the fin assembly, which has two opposite ends respectively connected to the pump unit and the storage chamber, the connection passage having two opposite ends respectively connected to the pump unit and the liquid storage chamber.

6 Claims, 6 Drawing Sheets

LIQUID-COOLED HEAT SINK

BACKGROUND OF THE INVENTION

1. Field of the Invention

The present invention relates to a liquid-cooled heat sink for an electronic device, more particularly to a liquid-cooled heat sink, which is constituted by a plurality of modules so as to form an integral body, thereby minimizing the size and simplifying the structure to enhance the heat dissipating performance.

2. The Prior Arts

When a computer or an electronic device is in operation, the central processor unit (CPU), the chips or other processing units within a main housing generate a lot of heat. If the generated heat is not expelled swiftly from the main housing, the main housing cannot maintain a certain temperature range there within and malfunction may result in the computer or the electronic device.

Traditionally, air-cooled heat sinks are generally employed to cool down the CPU, the chips or other processing unit. In most cases, heat dissipation fins are mounted in contact with the surface of the CPU, the chip or the other processing unit in order to absorb the generated heat while a fan unit is disposed on or nearby the fin assembly such that upon activation of the fan unit, the generated heat is expelled to an exterior of the main housing by downstream air flow of the fan unit. However, the more the CPU and the chips within an electronic device, the more the heat is generated, thereby resulting in unabling the air-cooled heat sink to expel the generated heat fully and entirely, which, in turn, may cause malfunction of the electronic device.

In order to solve the above-stated problem, a liquid-cooled heat sink has been proposed. The liquid-cooled heat sink utilizes a pump unit to activate a liquid to circulate within a looped system, which is provided with a heat exchanger to achieve the effect of heat exchange, thereby absorbing and expelling the heat generated from the CPU, the chips and et cetera. Some liquid-cooled heat sinks are disclosed by US patents, like U.S. Pat. Nos. 7,971,632, 8,245,764, 8,274,787 and 8,356,505.

In general, the liquid-cooled heat sink provides higher effective heat dissipation ability. However, it is noted that majority of the liquid-cooled heat sinks include more components and hence result in more assembly time. In addition, they have a larger size when compared to their preceding ones, and hence fail to satisfy the users' demands. The more components also result in a leakage potential factor in the liquid-cooled heat sinks. In other words, even though the liquid-cooled heat sink with the pump unit has a bulky size, the circulated liquid provides low heat dissipating ability.

SUMMARY OF THE INVENTION

Therefore, the objective of the present invention is to provide a liquid-cooled heat sink constituted by a plurality of modules so as to form an integral body, thereby minimizing the size and simplifying the structure to enhance the heat dissipating performance.

One feature of the present invention includes a heat absorption module, a liquid transport module and a heat exchange module, wherein the heat absorption module is connected to first ends of liquid inlet and outlet tubes of the liquid transport module while second ends of the liquid inlet and outlet tubes are respectively connected to a pump unit and a liquid storage chamber. The heat exchange module has two opposite ends respectively connected to the pump unit and the liquid storage chamber so as to constitute a minimized, integrally-formed and simplified heat sink of the present invention.

The liquid-cooled heat sink of the present invention accordingly includes a heat absorption module having a liquid storage container, at least one heat conductive side, a liquid inlet and a liquid outlet; a liquid transport module including at least one inlet tube and an outlet tube, the inlet tube having a first end connected spatially with the liquid inlet of the liquid storage container and a second end connected spatially with a pump unit, the outlet tube having a first end connected spatially with the liquid outlet of the liquid storage container and a second end connected spatially with a liquid storage chamber; and a heat exchange module including a fin assembly, at least one connection passage extending through the fin assembly and at least one fan unit disposed on the fin assembly, the fin assembly having two opposite ends respectively connected to the pump unit and the liquid storage chamber, the connection passage having two opposite ends respectively connected to the pump unit and the liquid storage chamber.

In one embodiment, the liquid-cooled heat sink of the present invention further includes a pump housing for enclosing the pump unit, the pump housing having a first cover formed with a first through hole, the liquid storage chamber having a second cover formed with a second through hole, the two opposite ends of the connection passage respectively extending into the first and second through holes so as to establish spatial communication between the pump unit and the liquid storage chamber.

Preferably, the fin assembly includes a plurality of fins disposed in a parallel manner. The connection passage extends through the plurality of fins in a direction perpendicular to each of the fins. In this way, the plurality of fins are connected to one another and the liquid within the connection passage absorbs the heat and transfers the same to the fins for dissipation.

In one embodiment, the fin assembly has one lateral side formed with at least one fastening seat via which the fan unit is seated on the lateral side.

Preferably, each of the fins defines a thickness exposed on the lateral side. The fastening seat is located on the fin assembly and is oriented perpendicular to the thickness of each of the fins. Once the fan unit is installed on the fin assembly, the air caused activation of the fan unit smoothly passes through a gap defined between adjacent two of the fins.

In one embodiment, the conductive side of the heat absorption module protrudes outwardly to a certain thickness while a plurality of fins are formed on an opposing side facing the conductive side in order to absorb the heat effectively.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENT

Figure 1:
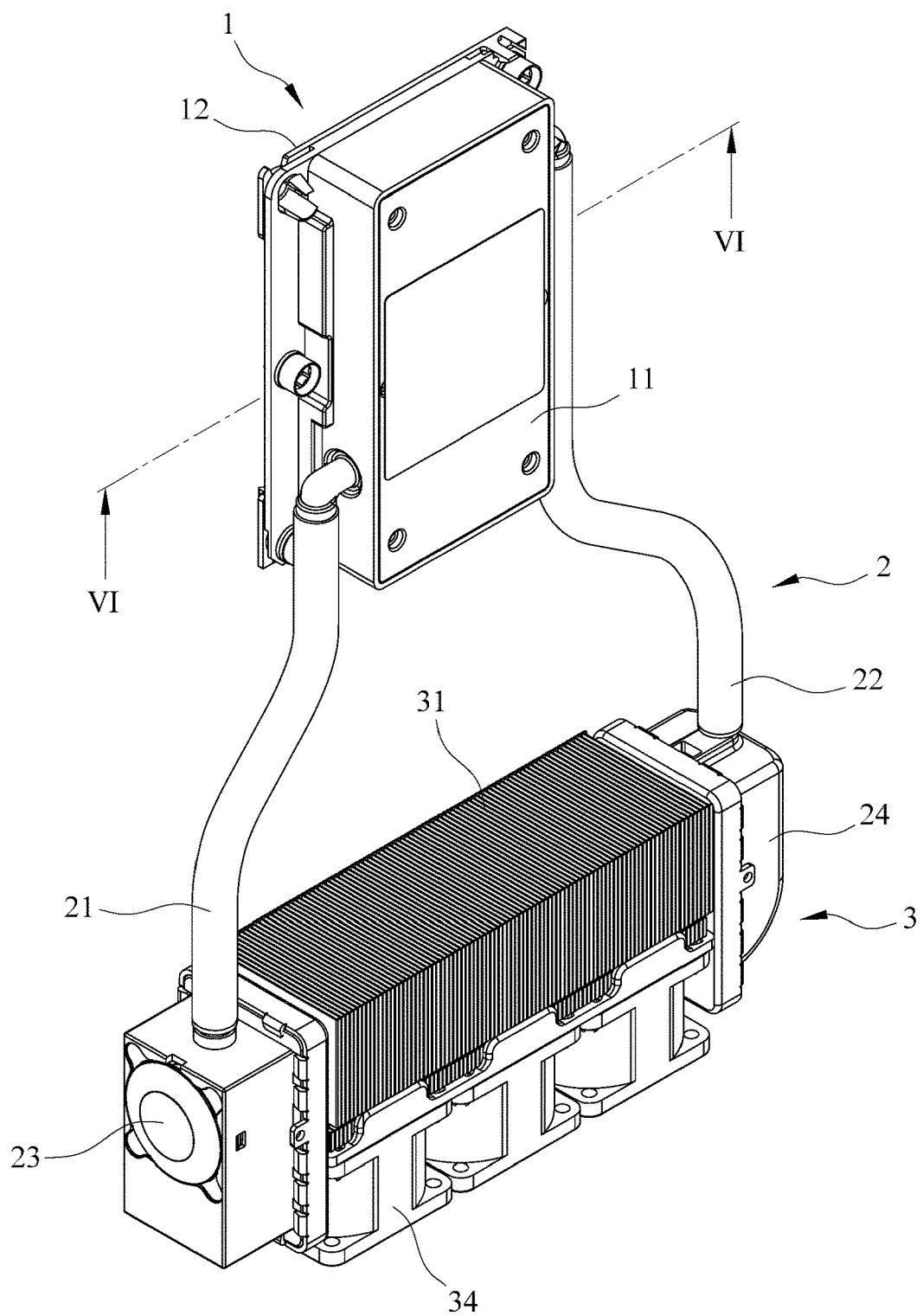
FIG. 1 shows a perspective view of a liquid-cooled heat sink of the present invention.
Figure 2:
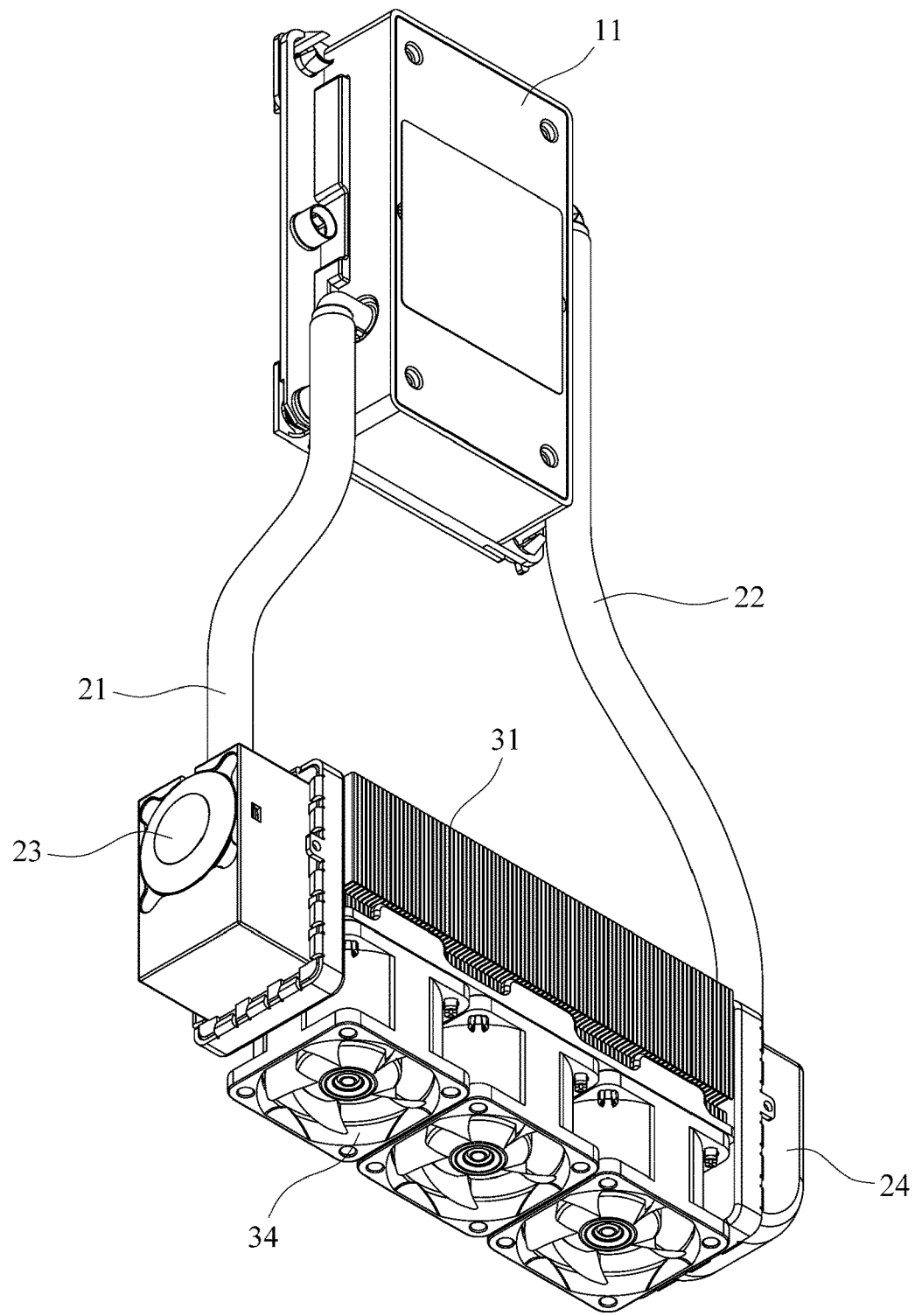
FIG. 2 shows a perspective view of the liquid-cooled heat sink of the present invention from another angle.
Figure 3:
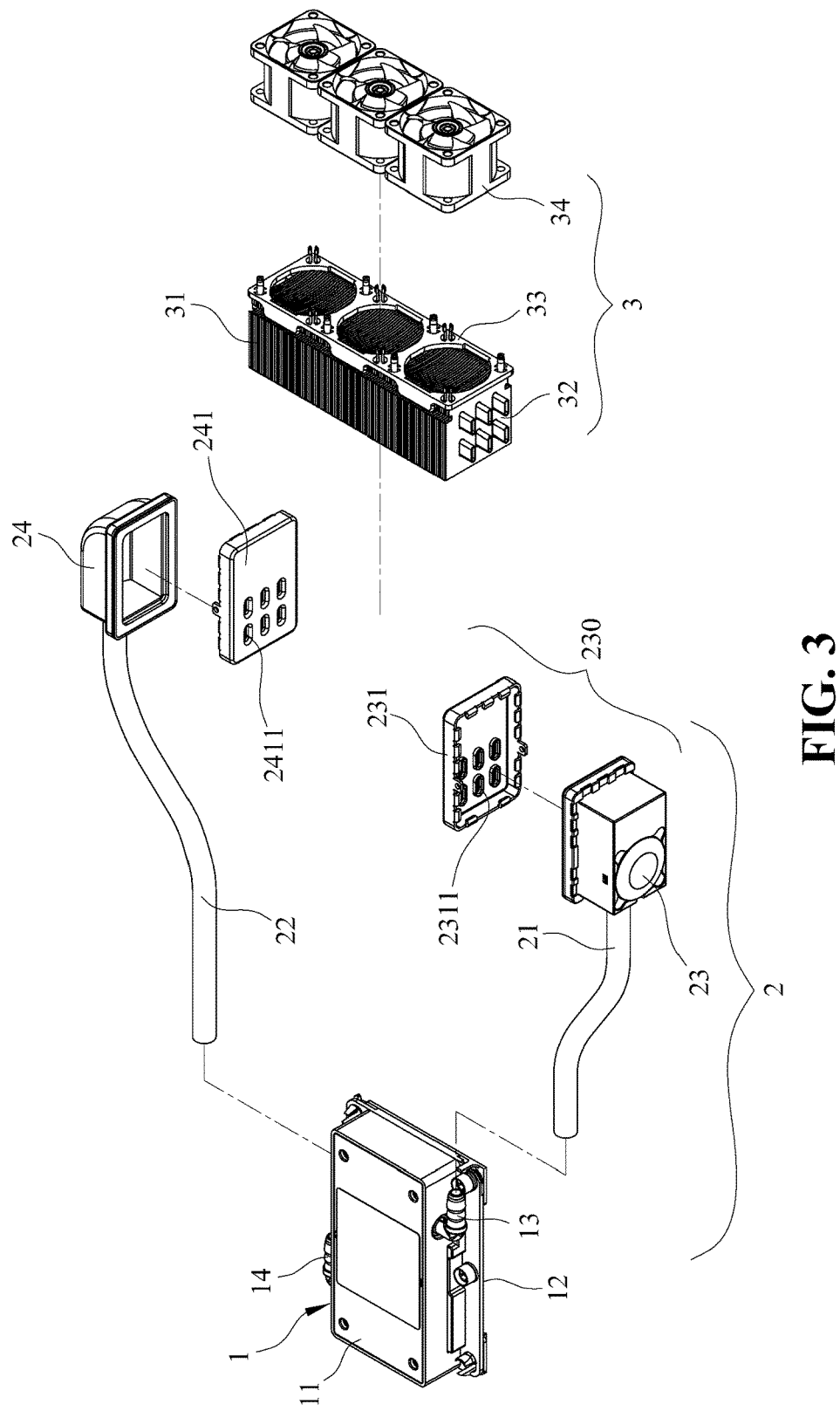
FIG. 3 shows an exploded view of the liquid-cooled heat sink of the present invention.

Referring to FIGS. 1 to 3, wherein FIG. 1 shows a perspective view of a liquid-cooled heat sink of the present invention; FIG. 2 shows a perspective view of the liquid-cooled heat sink of the present invention from another angle; and FIG. 3 shows an exploded view of the liquid-cooled heat sink of the present invention. As shown, the liquid-cooled heat sink of the present invention accordingly includes a heat absorption module 1, a liquid transport module 2 and a heat exchange module 3, wherein, the heat absorption module 1 includes a liquid storage container 11 constituted by a plurality of sidewalls so as to contain liquid therein, has at least one heat conductive side 12 and on the other sides, a liquid inlet 13 and a liquid outlet 14 are formed. Preferably the liquid inlet 13 and the liquid outlet 14 are symmetrically located relative to each other so as to facilitate connection with the liquid transport module 2. The conductive side 12 of the container 11 is used to contact with a heat generating source, such as CPU, chips and et cetera, in order to absorb the heat generated therefrom and transfer the absorbed heat to the cool liquid contained in the liquid storage container 11. Preferably, in one embodiment, the conductive side 12 of the heat absorption module 1 protrudes outwardly to a certain thickness while a plurality of fins (as shown in FIG. 3) are formed on an opposing side facing the conductive side in order to absorb the heat effectively.

As shown in FIG. 3, the liquid transport module 2 includes at least one inlet tube 21 and an outlet tube 22. In this embodiment the inlet and outlet tubes 21, 22 are hollow tubes for passage of the liquid therethrough and can be configured any shape to fulfill the target purpose. The inlet tube 21 has a first end connected spatially with the liquid inlet 13 of the liquid storage container 11 and a second end connected spatially with the output end 232 (see FIG. 4) of a pump unit 23. The outlet tube 22 has a first end connected spatially with the liquid outlet 14 of the liquid storage container 11 and a second end connected spatially with the coupler head 242 (see FIG. 4) of a liquid storage chamber 24. Preferably, the liquid-cooled heat sink of the present invention further includes a pump housing 230 for enclosing the pump unit 23. The pump housing 230 includes a first cover 231 formed with a first through hole 2311 (FIG. 3 shows a plurality of first through holes for connection with the heat exchange unit 3). Once the first cover 231 encloses one side of the pump housing 230, the pump unit 23 is not visible from an exterior of the pump housing 230, thereby providing aesthetic appearance of the present invention. Of course, the pump housing 230 is provided with a required opening for passing through of the inlet tube 21 for connection with the output end 232 of the pump unit 23. The liquid storage chamber 24 has a second cover 241 formed with a second through hole 2411 (FIG. 3 shows a plurality of second through holes for connection with the heat exchange unit 3). It is to note that a waterproof ring or washer should be placed when attaching the second cover 241 sealingly to the liquid storage chamber 24 so as to prevent leakage of liquid from the storage chamber 24.

Figure 4:
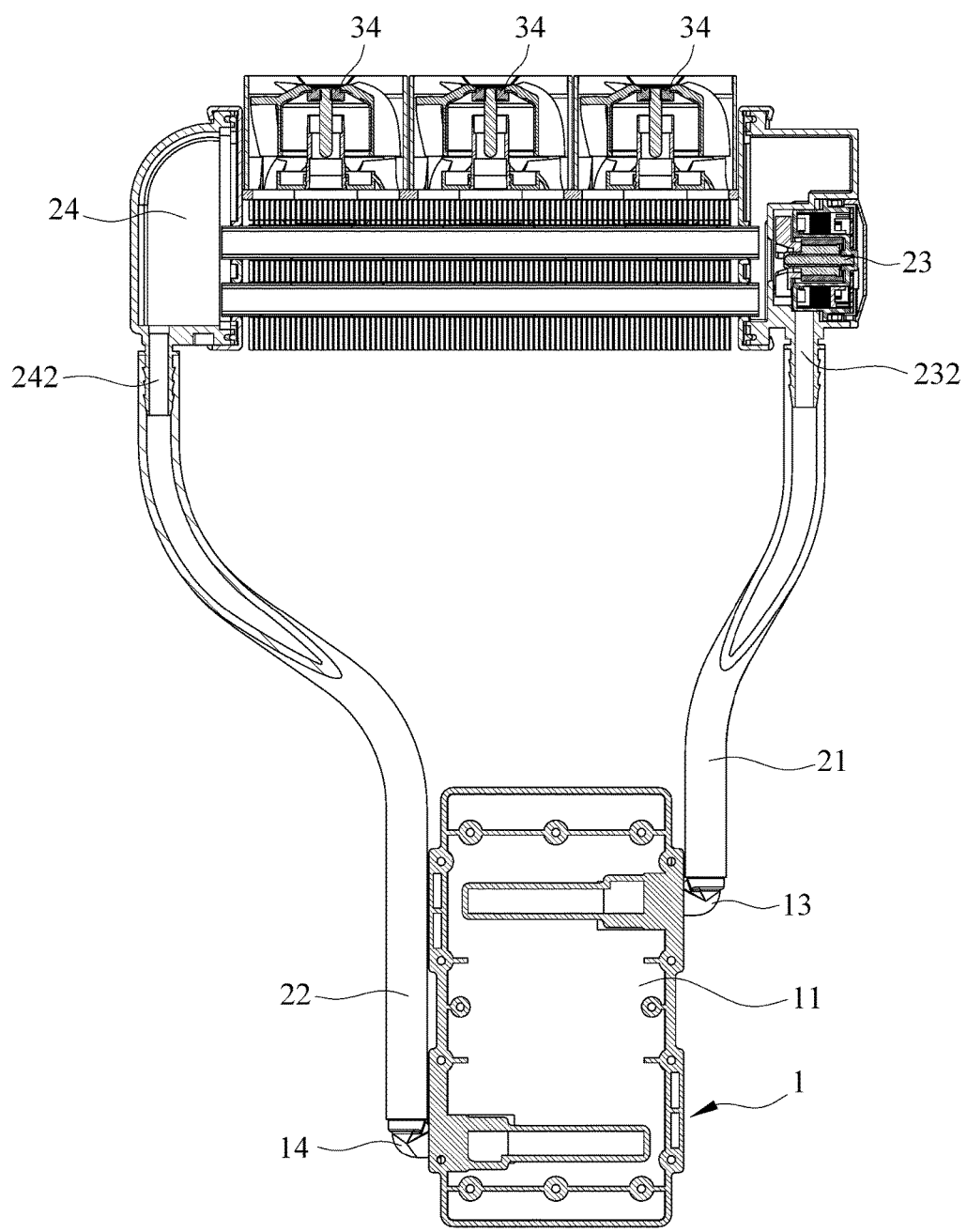
FIG. 4 shows a cross-sectional view of the liquid-cooled heat sink of the present invention.

The heat exchange module 3 includes a fin assembly 31, six connection passages 32 extending through the fin assembly 31 and three fan units 34 disposed on the fin assembly 31. The fin assembly 31 has two opposite ends respectively connected to the pump unit 23 and the liquid storage chamber 24. Each connection passage 32 has two opposite ends respectively connected to the pump unit 23 and the liquid storage chamber 24. As shown in FIGS. 1 to 3, the fin assembly 31 includes a plurality of fins disposed in a parallel manner so as to define a predetermined gap between adjacent pair of the fins to facilitate air passing through the gaps. The connection passages 32 extend through the plurality of fins in a direction perpendicular to each of the fins. Preferably, the fin assembly 31 has one lateral side formed with three sets of fastening seats 33 via which the fan units 34 are seated on the lateral side. In this embodiment, the fastening seats 33 are mounted on the lateral side of the fin assembly 31 via fastener screws. Preferably, each of the fins defines a thickness exposed on the lateral side. The fastening seat 33 is located on the fin assembly 31 perpendicular to the thickness of each of the fins. In this embodiment, two opposite ends of the connection passages 32 respectively extend through the fins and into the first and second through holes 2311, 2411 of the first and second covers 231, 241 so as to establish spatial communication with the pump unit 23 and the liquid storage chamber 24, as best shown in FIG. 4.

Figure 5:
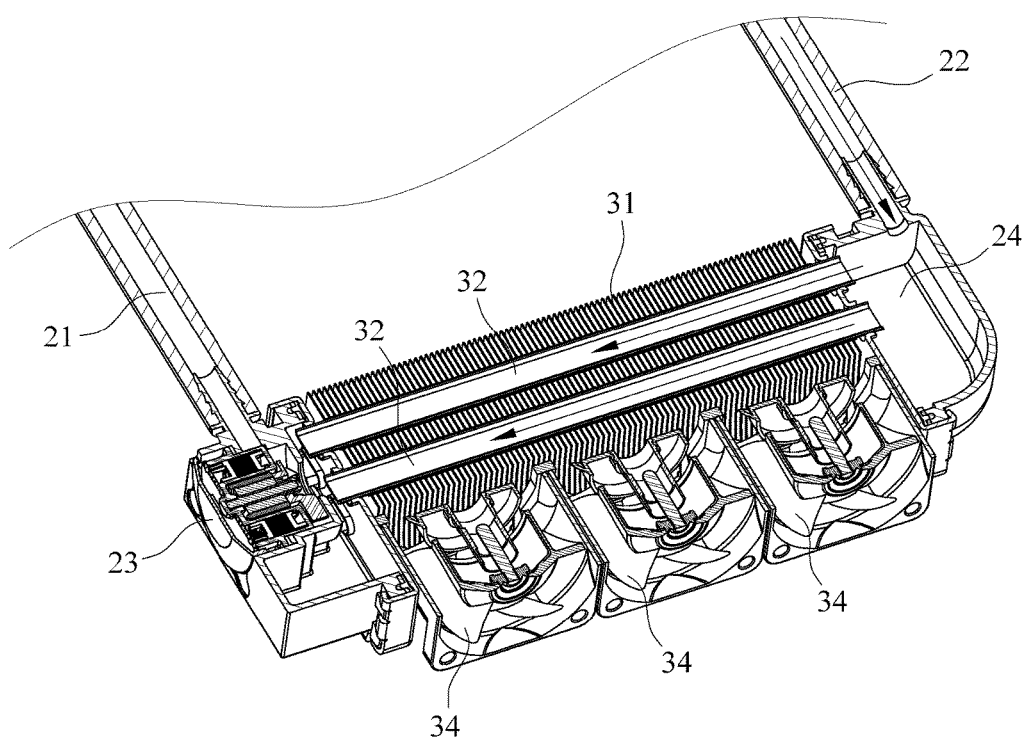
FIG. 5 shows a fragmentary cross-sectional view of the liquid-cooled heat sink of the present invention.
Figure 6:
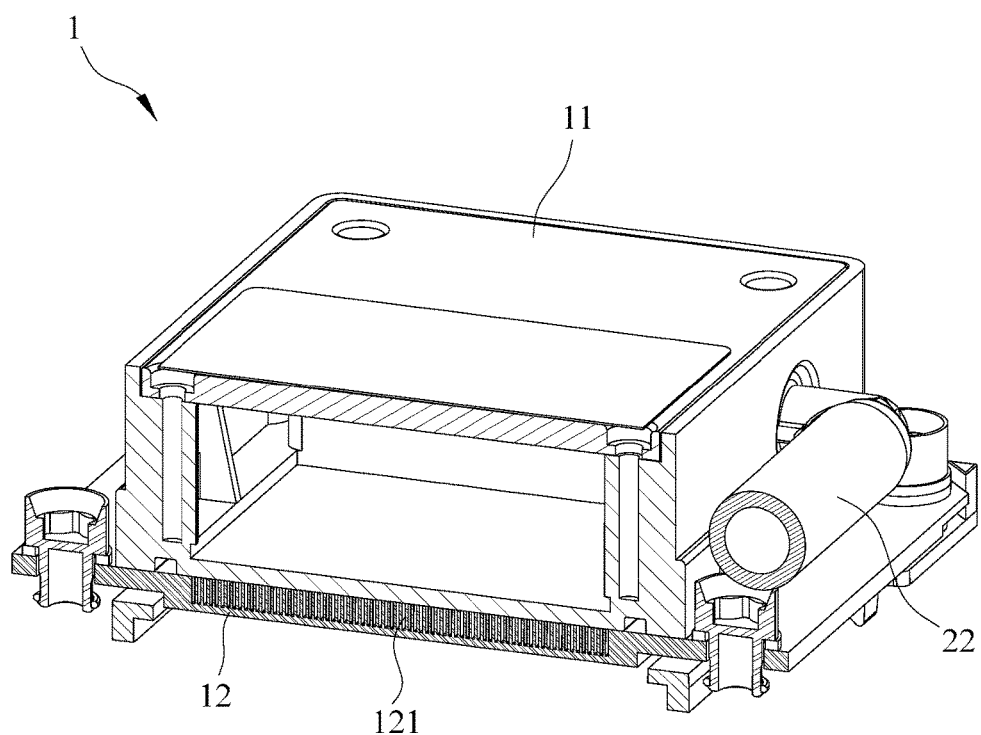
FIG. 6 shows a perspective view of a heat absorption module of the present invention.

To install the liquid-cooled heat sink of the present invention in an electronic device, first of all, the heat absorption module 1 is mounted in an electronic device in such a manner that heat conductive side 12 thereof is contact with a heat generating source, such as CPU and chips, where the heat conductive side 12 absorbs the heat generated therefrom and transfers the absorbed heat to the cool liquid contained in the liquid storage container 11. Upon activation of the pump unit 23 and the fan units 34, the pump unit 23 pumps in the cool liquid via the inlet tube 22 and the connection passages 32 and later through the output end 232 and the inlet tube 21 into the liquid storage container 11 so as to constitute a closed circulation system. As the heat-absorbed cool liquid passes through the connection passages 32, the heat is transferred to the fins of the fin assembly 31. At this time, the heat is expelled from the fins in the downstream direction of the air induced by the fan units 34 (as illustrated by arrows in FIG. 5), thereby effectively expelling the generated heat from an interior to an exterior of the electronic device.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A liquid-cooled heat sink comprising:
   a heat absorption module including a liquid storage container, at least one side wall of said liquid storage container disposed on a heat conductive plate, at least one liquid inlet and at least one liquid outlet disposed on said liquid storage container;
   a liquid transport module including at least one inlet tube and at least one outlet tube, said inlet tube having a first end connected with said liquid inlet of said liquid storage container, and said inlet tube having a second end connected with a pump unit, said outlet tube having a first end connected with said liquid outlet of said liquid storage container, and said outlet tube having a second end connected with a liquid storage chamber; and a heat exchange module including a fin assembly, at least one connection passage passing through said fin assembly and at least one fan unit disposed on said fin assembly, wherein said fin assembly has two opposite ends respectively connected to said pump unit and said liquid storage chamber, and each said connection passage has two opposite ends respectively connected to said pump unit and said liquid storage chamber, wherein the heat absorption module is disposed separately from the heat exchange module.

2. The liquid-cooled heat sink according to claim 1, wherein said pump unit is disposed inside a pump housing, said pump housing comprises at least one first through hole formed on a first cover, and said liquid storage chamber comprises at least one second through hole formed on a second cover, and wherein one of said two opposite ends of said connection passage is connected with said pump unit by passing through said first through hole and the other one of said two opposite ends of said connection passage is connected with said liquid storage chamber by passing through said second through hole.

3. The liquid-cooled heat sink according to claim 1, wherein each said connection passage is perpendicular to each of a plurality of fins on said fin assembly, and each said connection passage passes through said fin assembly.

4. The liquid-cooled heat sink according to claim 2, wherein at least one fastening seat is formed on one side of said fin assembly and said fan unit is disposed on said fastening seat.

5. The liquid-cooled heat sink according to claim 4, wherein each of said fins defines a thickness exposed on a lateral side of said fin assembly, and an axial center line of said fastening seat is perpendicular to said thickness of each of said fins on said fin assembly.

6. The liquid-cooled heat sink according to claim 5, wherein said heat conductive plate protrudes from said liquid storage container to form a thickness provided for forming a plurality of conductive fins thereon to face said side wall of said liquid storage container.

* * * * *